(12) United States Patent
Choi et al.

(10) Patent No.: US 6,286,077 B1
(45) Date of Patent: Sep. 4, 2001

(54) SYNCHRONOUS SEMICONDUCTOR MEMORY DEVICE WITH A PLURALITY OF MEMORY MODULES WHICH HAS AN ADDITIONAL FUNCTION FOR MASKING A DATA STROBE SIGNAL OUTPUTTED FROM EACH MEMORY MODULE

(75) Inventors: Joo Sun Choi; Seok Cheol Yoon, both of Ichon-shi (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/218,617

(22) Filed: Dec. 22, 1998

(30) Foreign Application Priority Data

Dec. 29, 1997 (KR) .................................................. 97-77437

(51) Int. Cl.[7] ....................................................... G06F 12/00
(52) U.S. Cl. ..................... 711/105; 365/189.01; 365/193; 365/203.03
(58) Field of Search ..................................... 711/105, 219; 365/52, 189.01, 189.05, 233, 193–238.5; 327/99

(56) References Cited

U.S. PATENT DOCUMENTS

| | | | |
|---|---|---|---|
| 5,218,684 | * 6/1993 | Hayes et al. | 711/219 |
| 5,513,135 | 4/1996 | Dell et al. | 365/52 |
| 5,587,961 | 12/1996 | Wright et al. | 365/233 |
| 5,850,368 | * 12/1998 | Ong et al. | 365/238.5 |
| 5,940,328 | * 8/1999 | Iwamoto et al. | 365/189.01 |
| 6,060,916 | * 5/2000 | Park | 327/99 |

OTHER PUBLICATIONS

Kim, C.H., et al., "A 64–Mbit, 640–MByte/s Bidirectional Data Strobed, Double–Data–Rate SDRAM with a 40–mW DLL for a 256–MByte Memory System", *IEEE Journal of Solid–State Circuits,* vol. 33 No. 11, pp. 1703–1710, Nov. 1998.

* cited by examiner

*Primary Examiner*—Do Hyun Yoo
*Assistant Examiner*—Nasser Moazzami
(74) *Attorney, Agent, or Firm*—Nath & Associates PLLC; Gary M. Nath; Marvin C. Berkowitz

(57) ABSTRACT

A chip set memory controller having a data strobe mask function is disclosed. The controller includes first through N-th memory modules operated in synchronous with a clock signal outputted from the chip set memory controller, whereby the data outputted from each memory module are masked by a data mask signal outputted from the chip set memory controller, and the operation of the data outputted from each memory module is controlled by a data strobe signal outputted from each memory module, for thereby implementing a reverse compatibility of a DQM function by additionally installing a pin in a DDR SDRAM and masking a data strobe signal.

10 Claims, 8 Drawing Sheets

SYNCHRONOUS SEMICONDUCTOR MEMORY DEVICE WITH A PLURALITY OF MEMORY MODULES WHICH HAS AN ADDITIONAL FUNCTION FOR MASKING A DATA STROBE SIGNAL OUTPUTTED FROM EACH MEMORY MODULE

BACKGROUND OF THE INVENTION

1. Field of the Invention

The present invention relates to a system including a number of memory modules and a chip set memory controller having a data strobe mask function.

2. Description of the Conventional Art

Generally, the DDR method is directed to a method for reading a data from a memory apparatus based on a rising edge and falling edge of a master clock signal and writing the data into the memory apparatus. In addition, in the DDR method, in order to obtain a high speed operation margin of the memory apparatus, a data strobe signal is used based on an echo clock.

The data strobe signal generates an echo clock in the same manner as the output of a first data output buffer when outputting the data, and in the chip set memory controller, the data are read in response to the data strobe signal.

In FIG. 1, reference numerals 12 through 18 represent a memory module containing a plurality of memory devices. Reference numeral 10 represents a chip set memory controller. Each of the memory devices is a dual in-line memory device. Therefore, the memory module represents a dual in-line memory module. As the memory device, a SDRAM is generally used. Preferably, the DDR SDRAM is used therefor.

The chip set memory controller outputs a mask clock CLK, and the master clock is applied to each of the dual in-line memories 12, 14, 16 and 18. Each dual in-line memory module inputs and outputs a data DQ in synchronous with the master clock. The data DQ of FIG. 1 represents a case that the data is read from the dual in-line memory module.

The DS of FIG. 1 represents a data strobe signal.

If a data strobe signal is not provided, the time required for the data outputted from the dual in-line memory module 12 which is nearest the chip set memory controller 10 to reach the memory controller is different from the time required for the data outputted from the farthest dual in-line memory module 18 to reach the memory controller. In addition, the case where the data is applied from the memory controller to the memory module is the same as the above-described case.

Meanwhile, when the data strobe signal is used, since the time required until the data is outputted from each dual in-line memory module is the same as the time required until the data reaches the memory controller, it is possible to implement a high speed operation of the memory.

However, in the case of the data strobe method, there is a problem that the output data mask(DQM: DQ MASK) may not be used, which is an important function of the SDRAM.

Namely, in the read mode, when operating the output data mask (DQM), the conventional SDRAM does not selectively control the data strobe signal. In the write mode, the same problem occurs.

The above-described problems will be explained in more detail with reference to FIGS. 2A and 2B.

FIG. 2A illustrates that there is not a data strobe mask function. Each memory module includes a plurality of DDR SDRAMs. Each of memory modules 20 and 22 includes the same number of DDR SDRAMs and co-uses a data bus DQ, a data strobe DS, and an output data mask DQM. The output data is formed of 8-byte.

The operation of FIG. 2A will be explained with reference to FIG. 2B.

In FIG. 2B, it is assumed that the burst length is 8.

Reference character CLK represents a mask clock, DQ_M1 represents a data outputted from a first memory module 20, and DQ_M2 represents a data outputted from a second memory module 22. In addition, reference character DQM represents an output data mask signal, QS_M1 represents a data strobe signal outputted from the first memory module 20, QS_M2 represents a data strobe signal outputted from the second memory module 22, and QS BUS represents an output data strobe bus.

The data are accessed from the first module 20 for the first through third periods of the master clock, and the data of the second module 22 are accessed for the fourth and fifth periods of the clock.

The data outputted from the first module 20 are masked in accordance with an output data mask (DQM) signal. However, in this case, while the data strobe QS_M1 from the first memory module 20 continuously maintains an operation state, the data strobe QS_M2 from the second memory module 22 is enabled. Since the memory modules 20 and 22 co-use the output data strobe bus QS BUS, a bus contention may occur at the portion "A".

Namely, in the conventional art, when operating the output data mask DQM, it is impossible to selectively control the data strobe signal.

SUMMARY OF THE INVENTION

Accordingly, it is an object of the present invention to provide a chip set memory controller having a data strobe mask function which overcomes the aforementioned problems encountered in the conventional art.

It is another object of the present invention to provide a chip set memory controller having a data strobe mask function which is capable of implementing a reverse compatibility of a DQM function by additionally installing a pin in a DDR SDRAM and masking a data strobe signal.

In order to achieve the above objects, there is provided a chip set memory controller having a data strobe mask function according to the first embodiment of the present invention which includes first through N-th memory modules operated in synchronous with a clock signal outputted from the chip set memory controller, whereby the data outputted from each memory module are masked by a data mask signal outputted from the chip set memory controller, and the operation of the data outputted from each memory module is controlled by a data strobe signal outputted from each memory module.

In order to achieve the above objects, there is provided a chip set memory controller having a data strobe mask function according to a second embodiment of the present invention which includes first through N-th memory modules operated in synchronous with a clock signal outputted from the chip set memory controller, whereby the data inputted into each memory module are masked by a data mask signal outputted from the chip set memory controller, and the operation of the data inputted into each memory module is controlled by a data strobe signal outputted from each memory module.

In the first and second embodiments of the present invention, the chip set memory controller output a data strobe mask signal controlling an operation of the data strobe signal.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims as a result of the experiment compared to the conventional arts.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The embodiments of the present invention will be explained with refernece to the accompanying drawings.

Figure 3:
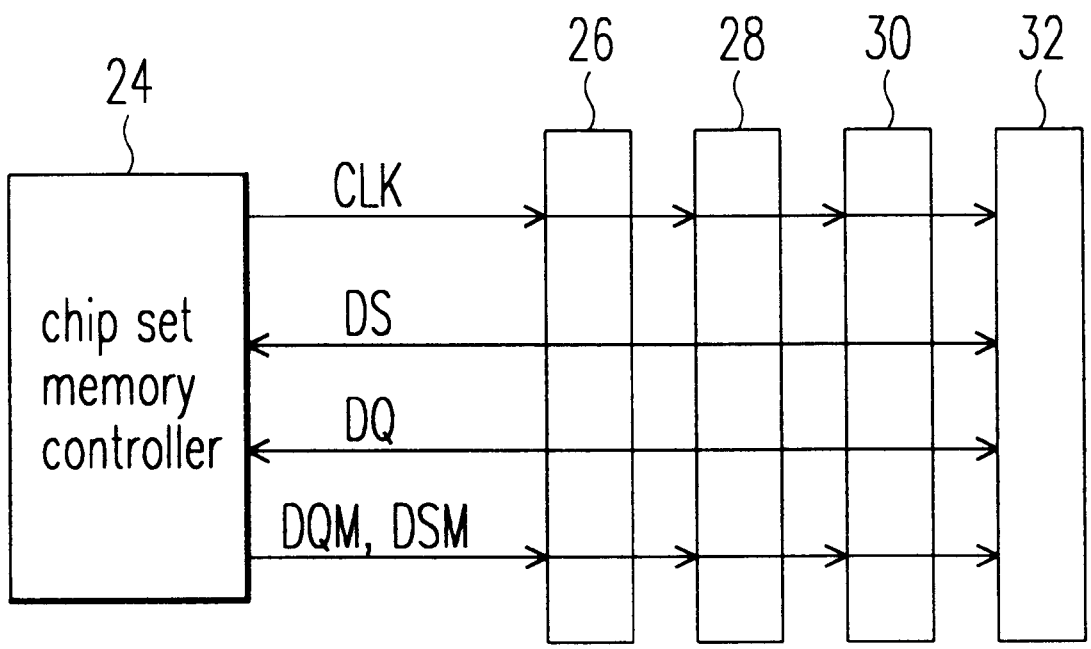
FIG. 3 is a block diagram illustrating a system having a data strobe mask function according to the present invention.

FIG. 3 illustrates a system having a data strobe mask function according to the present invention.

In FIG. 3, reference numbers 26 to 32 represent a memory module including a plurality of memory devices, and 24 represents a chip set memory controller. Each of the memory devices is a conventional dual in-line memory device. As a memory device, SDRAM is generally used, but more preferably, DDR SDRAM should be used.

In the present invention, the chip set memory controller 24 applies a mask clock CLK to the dual in-line memory modules 26, 28, 30 and 32, respectively. Each of the dual in-line memory modules 26, 28, 30 and 32 outputs an output data DQ in synchronous with the master clock. Differently from the conventional art, the DDR SDRAM according to the present invention includes a data strobe mask(DSM) pin for masking the data strobe.

Figure 4:
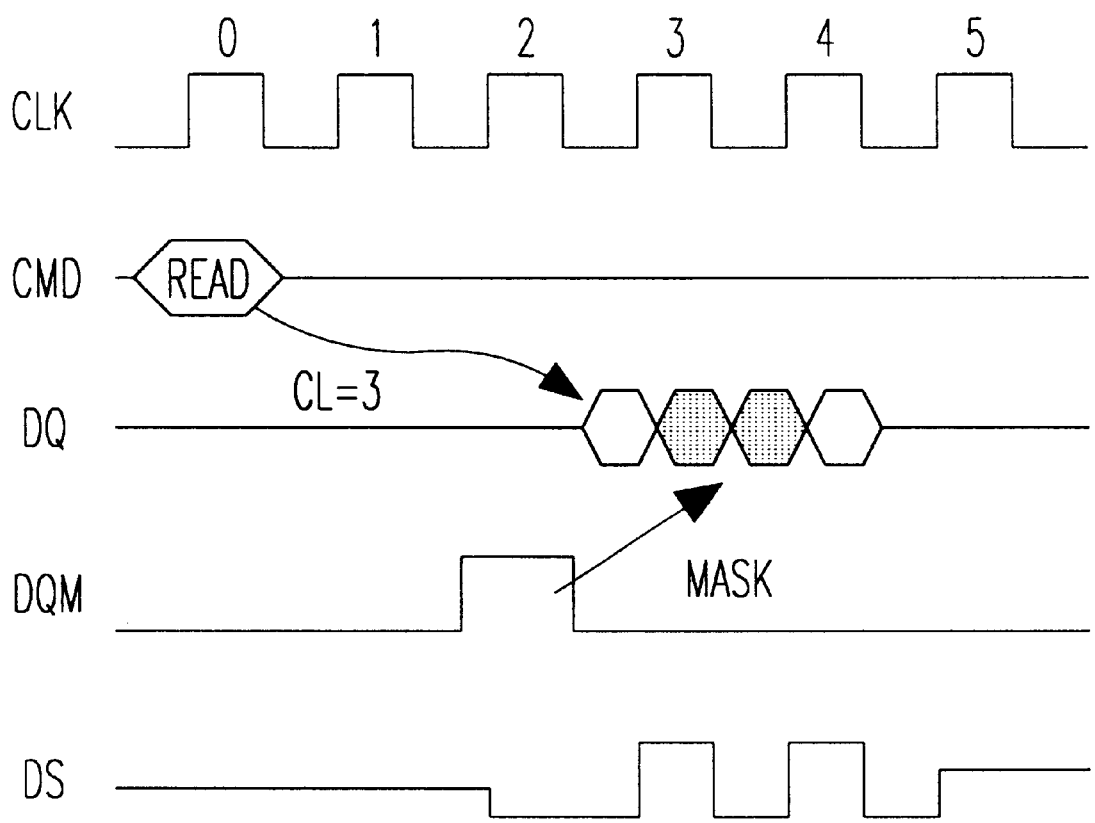
FIG. 4 is a wave form diagram for explaining a function of an output data mask signal.
Figure 5:
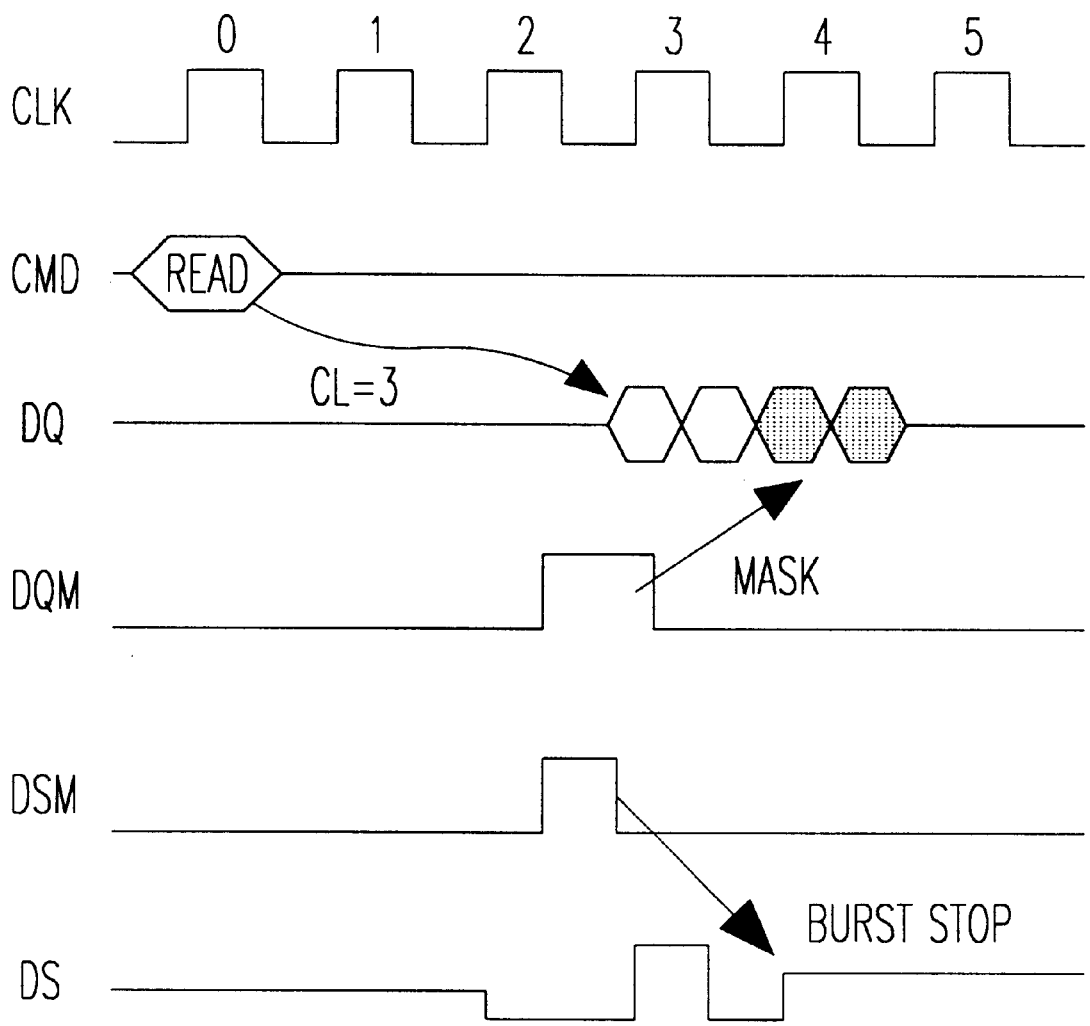
FIG. 5 is a wave form diagram for explaining a function of a data strobe mask signal.

FIG. 4 is a wave form diagram for explaining a function of an output data mask signal, and FIG. 5 is a wave form diagram for explaining a function of a data strobe mask signal.

As shown in FIG. 4, when a read instruction is inputted at the clock 0, assuming that a CAS latency is 3, the data strobe DS is transmited at clock 2 from a high impedance to a low impedance. Next, at clock 3, the first data is outputted, and thereafter the data are sequentially outputted at the rising edge and falling edge of the master clock.

The case that the second and third data are outputted when the length of the burst of the data is 4 will be explained. If the output data mask latency(DQM latency) is 1.5, the second and third data DQ are masked in accordance with a high level output data mask(DQM) signal inputted at the clock 2.

Even at the falling edge of the clock 3.5 and the rising edge of the clock 4, the memory controller 24 strobes the data in response to the data strobe(DS) signal. Therefore, the memory controller should be notified of the time when the output data DQ is masked. In the case as shown in FIG. 3, the memory controller is not notified of the time when the data is masked. Therefore, the output data mask(DQM) signal can not control the data strobe(DS).

Therefore, in the present invention, in order to mask the data strobe to the DDR SDRAM, a data strobe mask(DSM) pin is additionally used.

As shown in FIG. 5, the output data mask DQM controls only the masking with respect to the output data DQ, and the data strobe mask(DSM) controls only the data strobe(DS). For example, as shown in FIG. 5, the third and fourth data are masked by the data strobe mask(DQM) signal. In addition, the data strobe(DS) signal is controlled by the data strobe mask(DSM) signal for thereby implementing a burst stop.

The present invention will be explained in more detail with reference to FIGS. 6A and 6B.

Figure 6A:
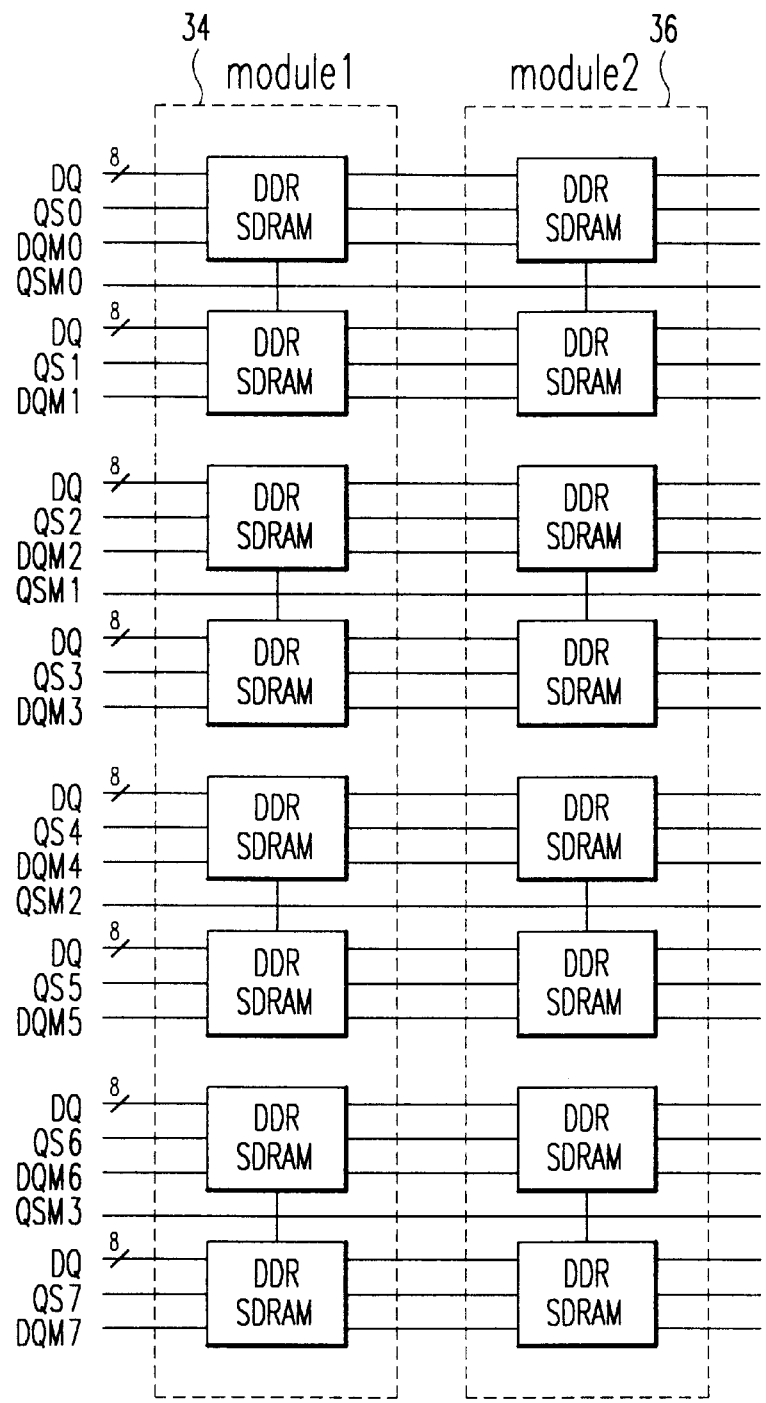
FIGS. 6A and 6B are views for explaining the construction of a chip set and an operation of the same according to the present invention.

As shown in FIG. 6A, the memory modules 34 and 36 each includes a plurality of DDR SDRAMs.

Figure 1:
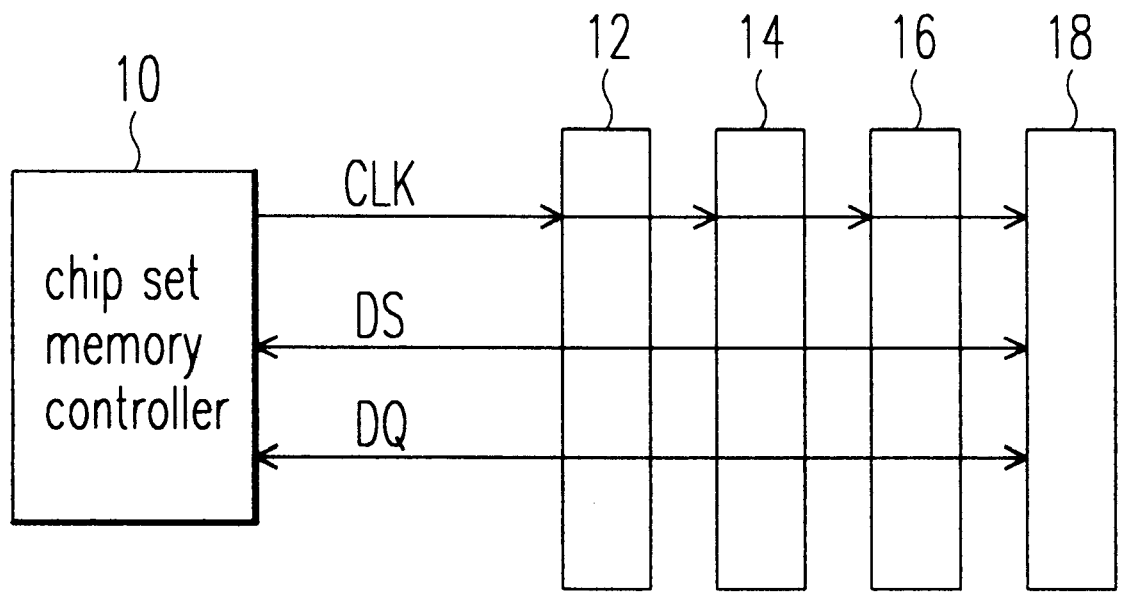
FIG. 1 is a block diagram illustrating a system including a conventional memory controller and memory module.
Figure 2A:
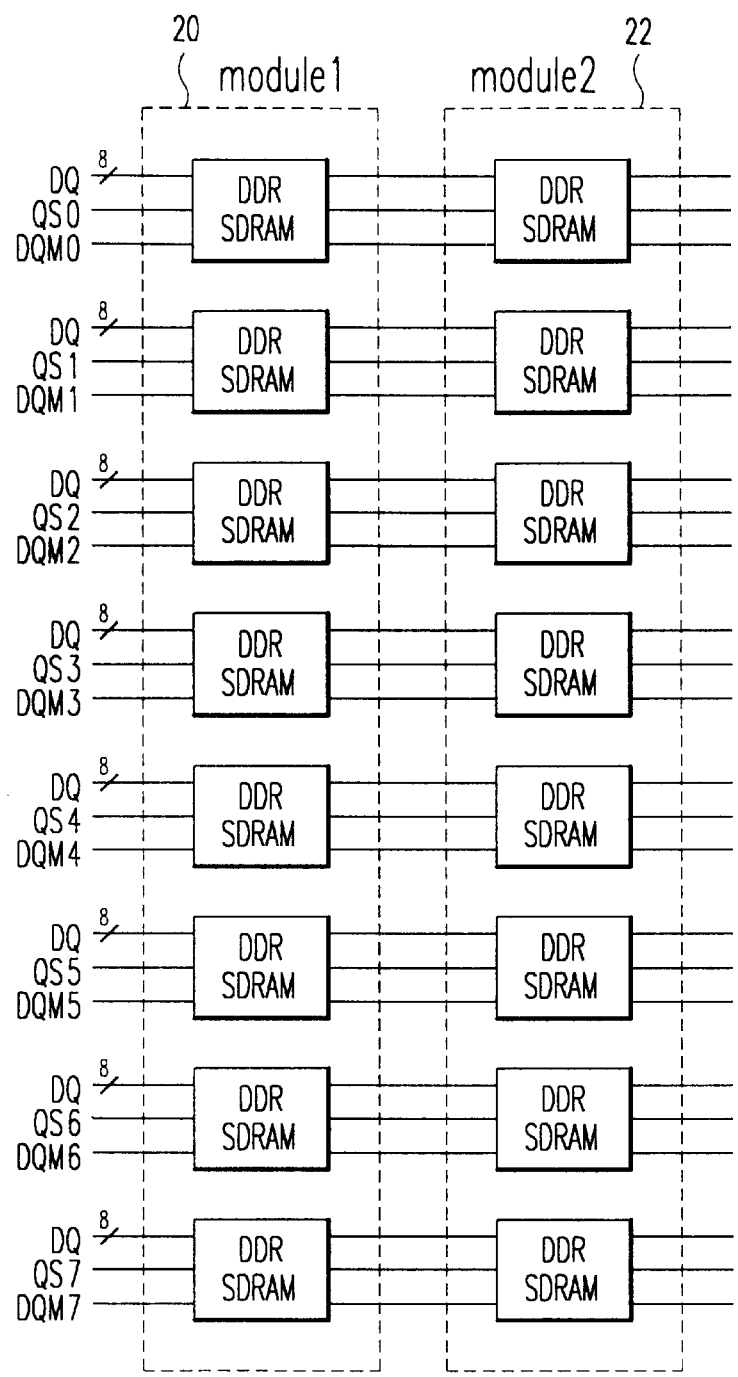
FIGS. 2A and 2B are views for explaining a problem of a system which does not have a data strobe mask function.
Figure 2B:
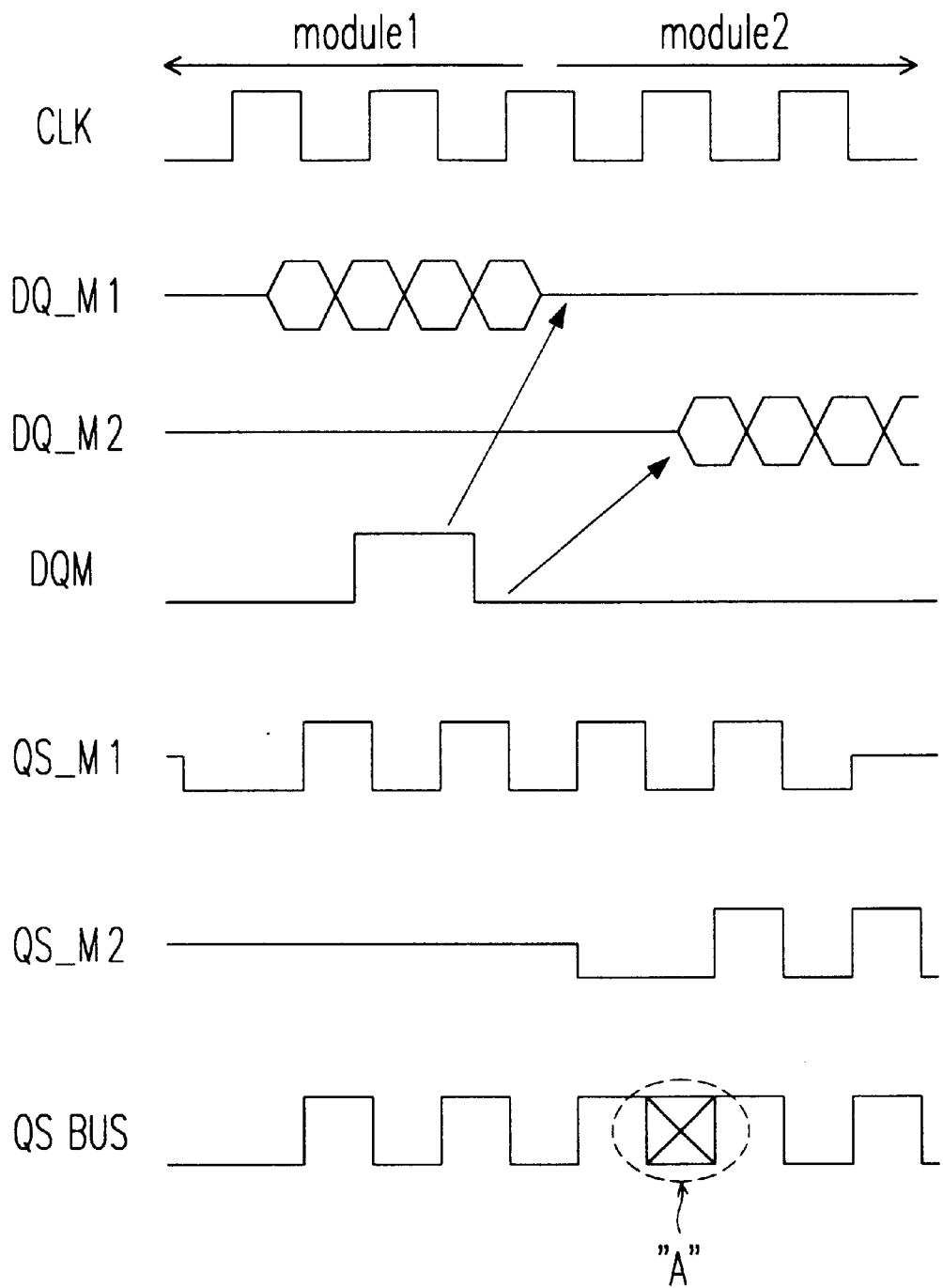

Identically to the features of FIG. 2A, the memory modules 34 and 36 co-use the data bus(DQ), the data strobe(DS) and the output data mask(DQM) signal except for the feature that the output strobe mask(QSM) pin is additionally provided. The output strobe mask signals of the neighboring DDR SDRAM in each memory module are connected to each other. In addition, the data strobe mask signals of the neighboring memory module are co-used.

Figure 6B:
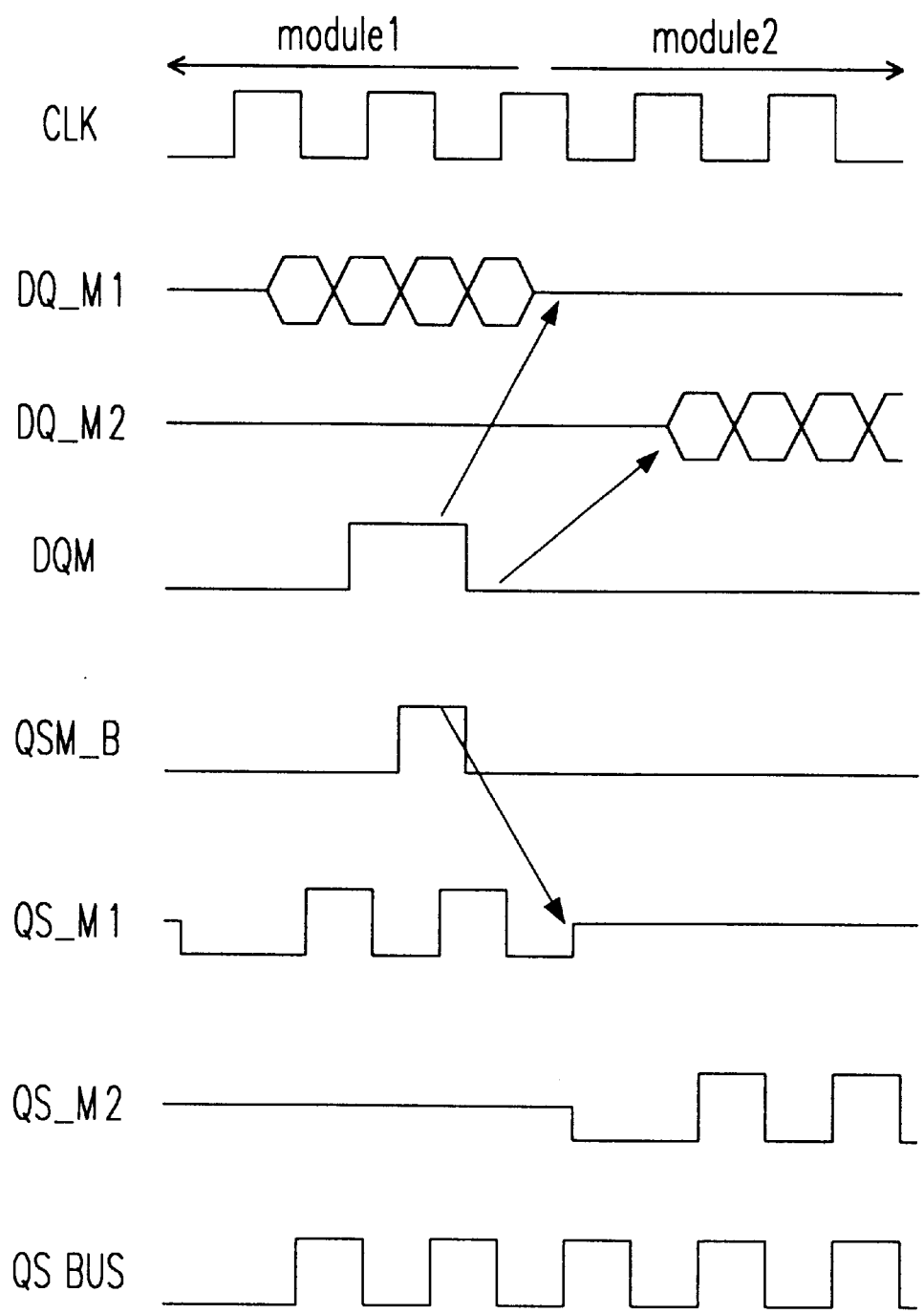

FIG. 6B is a signal waveform diagram related to FIG. 6A.

FIG. 6B illustrates the case that the length of the burst is 8.

Reference character CLK represents a mask clock, DQ_M1 represents a data outputted from the first memory module 34, DQ_M2 represents a data outputted from the second memory module 36, DQM represents an output data mask signal, QSM_B represents a data strobe mask signal, and a script character B represents an active state when the data strobe mask signal is a low level. In addition, reference character QS_M1 represents a data strobe signal from the first memory module 34, QS_M2 represents a data strobe signal from the second memory module 36, and QS BUS represents an output data strobe.

As shown therein, the data of the first memory module 34 is accessed at the clocks 0,1,2, and the data of the second module 36 is accessed at the clocks 3 and 4. The read operation of the first module 34 is masked by the output data mask DQM. The data strobe signal QS_M1 and the data strobe signal QS_M2 are controlled by the data strobe mask signal QSM_B.

The chip set memory controller receives a data in response to the data strobe signals QS_M1 and QS_M2. As shown therein, in the present invention, since the output data strobe QSM_B independently controls the data strobe signals QS_M1 and QS_M2 of the modules 34 and 36, the bus contention does not occur.

In the above description, the case that the data were read from the memory module was explained. The case that the data are written into the memory module is the same as the above-described case. When writing the data into the memory module, the data strobe signal is outputted from the memory controller.

As described above, in the present invention, it is possible to implement a mask function of the data outputted at the rising edge and falling edge of the clock in the DDR SDRAM adapting the data strobe method by additionally providing the output strobe mask pin.

In addition, in the present invention, a gapless operation is implemented in the data read mode by preventing a bus collision of the data.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A synchronous semiconductor memory device with a plurality of memory modules, the memory modules operating in synchronous with a clock signal, comprising:

a chip set memory controller that controls a data input/output of the plurality of memory modules by outputting the clock signal; and a data strobe mask signal pin for receiving a data strobe mask signal, wherein in reading a data from the plurality of memory modules, the plurality of memory modules provides the chip set memory controller with a data strobe signal for strobing the data, and the chip set memory controller outputs a data mask signal for masking the data and an additional data strobe mask signal for masking the data strobe signal, to the plurality of memory modules.

2. The synchronous semiconductor memory device as set forth in claims 1, wherein said each memory module includes a plurality of SDRAMs.

3. The synchronous semiconductor memory device as set forth in claims 1, wherein said each memory module includes a plurality of DDR SDRAMs.

4. The synchronous semiconductor memory device as set forth in claim 3, wherein said DDR SDRAM includes the data strobe mask signal pin for receiving the data strobe mask signal.

5. A synchronous semiconductor memory device comprising:

a chip set memory controller having a data strobe mask function, first through N-th memory modules operated in synchronous with a clock signal outputted from the chip set memory controller, and a data strobe mask signal pin for receiving a data strobe mask signal, whereby the data inputted into each memory module are masked by a data mask signal outputted from the chip set memory controller, and the operation of the data inputted into each memory module is controlled by a data strobe signal outputted from each memory module.

6. The synchronous semiconductor memory device as set forth in claim 5, wherein said chip set memory controller outputs the data strobe mask signal controlling the operation of the data strobe signal.

7. The synchronous semiconductor memory device as set forth in claims 5, wherein said each memory module includes a plurality of SDRAMs.

8. The synchronous semiconductor memory device as set forth in claims 5, wherein said each memory module includes a plurality of DDR SDRAMs.

9. The synchronous semiconductor memory device as set forth in claim 8, wherein said DDR SDRAM includes the data strobe mask signal pin for receiving the data strobe mask signal.

10. A synchronous semiconductor memory device, comprising:

first to N-th memory modules having a plurality of memory devices, and, a chip set memory controller for controlling the operations of the first to N-th memory modules, the chip set memory controller having a data strobe mask function, wherein the first through N-th memory modules operate in synchronous with a clock signal outputted from the chip set memory controller, wherein the data outputted from each memory module are masked by a data mask signal outputted from the chip set memory controller, wherein the operation of the data outputted from each memory module is controlled by a data strobe signal outputted from each memory module, wherein the chip set memory controller outputs a data strobe mask signal controlling the operation of the data strobe signal, and wherein each of the memory devices include a data strobe mask signal pin for receiving the data strobe mask signal; and wherein said each memory module includes a plurality of DDR SDRAMs.

\* \* \* \* \*